United States Patent [19]

Cronin et al.

[11] Patent Number: 4,962,058
[45] Date of Patent: Oct. 9, 1990

[54] PROCESS FOR FABRICATING MULTI-LEVEL INTEGRATED CIRCUIT WIRING STRUCTURE FROM A SINGLE METAL DEPOSIT

[75] Inventors: John E. Cronin, Milton; Pei-ing P. Lee, Williston, both of Vt.

[73] Assignee: International Business Machines Corporation, Armonk, N.Y.

[21] Appl. No.: 337,807

[22] Filed: Apr. 14, 1989

[51] Int. Cl.⁵ ............................................. H01L 5/00
[52] U.S. Cl. ................................. 437/187; 437/228; 437/182; 357/69
[58] Field of Search ............. 437/187, 245, 228, 189, 437/190, 192, 194, 198, 199, 225, 182, 203; 148/DIG. 26, DIG. 20; 357/71, 69

[56] References Cited

U.S. PATENT DOCUMENTS 3,801,880  4/1974  Harada et al. ........................ 357/71
3,847,690  11/1974  Campbell, Jr. et al. ............ 437/228
3,890,636  6/1975  Harada et al. ........................ 357/71

*Primary Examiner*—Brian E. Hearn
*Assistant Examiner*—Tuan Nguyen
*Attorney, Agent, or Firm*—Sughrue, Mion, Zinn, Macpeak & Seas

[57] ABSTRACT

A process of forming a multi-level semiconductor metallization structure from a single deposit layer of metal. The process provides the versatility of allowing stud-up, stud-down, thick and/or thin metallization structure lines to be formed from the single layer of metal. The thick metallization structure lines are low resistance lines, and the thin metallization lines are low capacitance lines. The separation of the thin metallization lines from the semiconductor substrate can be controlled further to decrease capacitive effects.

4 Claims, 3 Drawing Sheets

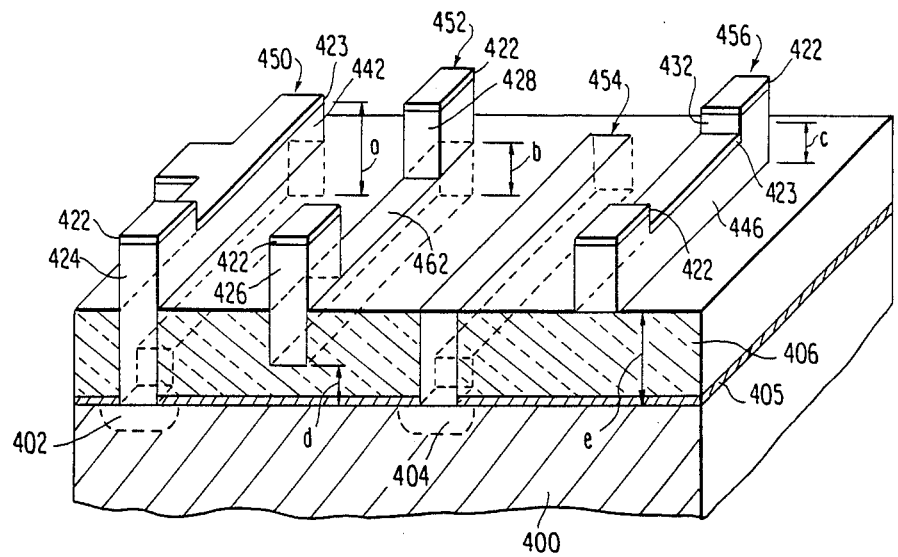
FIG. 4D
FIG. 5
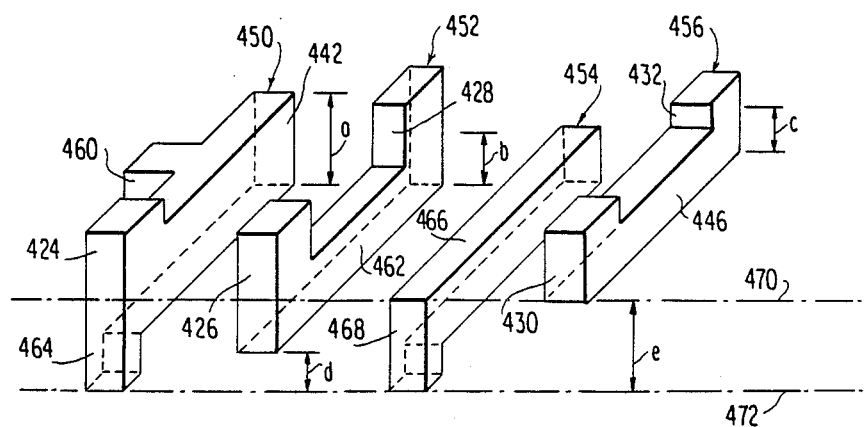

PROCESS FOR FABRICATING MULTI-LEVEL INTEGRATED CIRCUIT WIRING STRUCTURE FROM A SINGLE METAL DEPOSIT

CROSS-REFERENCE TO RELATED APPLICATIONS

This is a division of application Ser. No. 043,714 filed Apr. 29, 1987, now abandoned.

Reference is made to co-pending U.S. Pat. application Ser. No. 791,860, entitled "Chem-Mech Polishing Method for Producing Coplanar Metal/Insulator Films On A Substrate," filed Oct. 28, 1985 by Beyer et al, and assigned to the assignee of the present application. This application is directed to forming aperatures in an insulator layer, overfilling these apertures with metal, and polishing the metal back so that portions above the surface of the insulator layer are removed.

Reference is made to co-pending U.S. Pat. application Ser. No. 791.861, entitled "Method For Removing Protuberances At the Surface of A Semiconductor Wafer Using A Chem-Mech Polishing Technique," filed Oct. 28, 1985 by Beyer et al, and assigned to the assignee of the present application. This application is directed to planarizing oxide protuberances by using a silicon nitride layer as an etch-stop.

Reference is made to co-pending U S. Pat. application Ser. No. 791,887, entitled "Method For Producing coplanar Multi-Level Metal/Insulator Films On A Substrate And For Forming Patterned Conductive Lines Simultaneously With Stud Vias," filed Oct. 28, 1985 by Chow et al, and assigned to the assignee of the present application. This application is directed to patterning a glass layer so that it simultaneously defines a wiring plane and an interconnection stud filling the patterned glass with metal so as to form the structures, and polishing portions of the metal above the surface of the glass layer so that the metal is coplanar with the glass.

BACKGROUND OF THE INVENTION

1. Field of the Invention

The present invention relates to a multi-level integrated circuit wiring structure formed from a single metal deposit.

2. Background Art

Once a semiconductor substrate has been processed to form the desired circuits, the device must then be provided with a wiring structure. A term which is synonymous with "wiring structure" is that of "metallization structure". A first prior art method which utilizes a layer-by-layer construction approach to provide a wiring structure is shown in FIG. 1.

In detailing the first steps in this approach, a semiconductor substrate 100 is processed to provide semiconductor circuits 102 and 104 and then an insulating layer 106 is formed on top of the semiconductor substrate 100. Next, the insulating layer 106 is masked and etched to provide wiring trenches 107 and 111. These wiring trenches 107 and 111 are etched completely through the insulating layer 106 at locations which correspond to the locations of the semiconductor circuits 102 and 104, respectively. The wiring trenches 107 and 111 are then filled with a conductive material 110 and 114.

Once the wiring trenches 107 and 111 have been filled with the conductive material, the surface of the insulating layer 106 is planarized. The remaining construction of the desired wiring structure proceeds with the formation of successive insulating layers 118, 124, 130 and 136, each of which is masked and etched to form wiring trenches which are then filled with a conductive material.

In the example illustrated in FIG. 1, two resulting wiring structures are shown. The first, consisting of the conductive material deposits 110, 120, 126, 132 and 138, provides connection to the semiconductor circuit 102, and the second, consisting of the conductive material deposits 114, 122, 128 and 134, provides connection to the semiconductor circuit 104.

The above approach to constructing a multi-level wiring structure is well known in the art, for example, U.S. Pat. No. 3,838,442 - Humphreys (assigned to the assignee of this application), the teaching of which is incorporated herein by reference.

The multiple layer approach shown in the example of FIG. 1 is disadvantageous in several respects. First, an excessive number of masking and deposition steps are required at the end-of-the-line processing stage, whereby manufacturing yield may be lowered. Next, and more importantly, the resulting wiring structure of FIG. 1 a number of metallic interfaces, are formed within the wiring structure. These interfaces add to the overall wiring structure resistance. Furthermore, these localized high resistance areas are prone to overheating and thermal failure.

As a result of the trend of the semiconductor industry toward extremely dense semiconductor circuits, the contact resistance of wiring structures has become a large concern. In this regard, the excessive contact resistances encountered in the prior art approach of FIG. 1 have been found intolerable.

A second prior art approach, which reduces wiring structure metallic interfaces and the number of processing steps, is that of the stud-down approach shown in FIG. 2. In FIG. 2, features which are the same as those in FIG. 1 have been designated by the same reference numerals.

In FIG. 2, the semiconductor substrate 100 has been processed to form the semiconductor circuits 102 and 104. In detailing the processing steps to form the wiring structure, an insulating layer 200 is formed on top of the semiconductor substrate 100. The insulating layer 200 is masked with a first mask, and then partially etched to form wiring troughs 202 and 204. A second mask is then applied, and the insulating layer 200 is further etched to form stud-down vias 206 and 208 which extend down from the bottom portion of the wiring troughs 202 and 204, respectively.

Methods of forming stud-down via wiring structures are well known in the art. As an example, U S. Pat. No. 3,904.454 issued to Magdo et al. and assigned to the assignee of this application, discloses a method of forming a stud-down via using a first mask to define a slot in a first direction, and then using a second mask to define and etch an intersecting slot in an intersecting direction. The stud-down via is formed at the intersection of the two etched slots. Another disclosure of the stud-down via approach is found in U.S. Pat. No. 4,541.893 issued to Knight.

Once formed, the wiring troughs 202 and 204 and the stud-down vias 206 and 208 are filled with a conductive material. The entire surface of the insulating layer 200 is then planarized.

To form the next portion of the desired wiring structure, the wiring troughs 216 and 218 and their corresponding stud-down vias 220 and 222 are etched in an insulating layer 214. Once etched, the wiring troughs 216 and 218 and the stud-down vias 220 and 222 are filled with conductive materials 224 and 226, respectively. The wiring structure is completed by forming trench 232 in an insulating layer 228 and filling the trench with a conductive material 230.

In comparing the wiring structures of FIGS. 1 and 2, note that the two conductive material deposits of FIG. 2 have replaced the four conductive material deposits of FIG. 1. Thus, the stud-down approach of FIG. 2 is advantageous over the approach of FIG. 1 in that the number of metallic interfaces has been reduced by 50%, and the number of processing steps in the resultant wiring structure has also been reduced.

Another prior art approach which is very similar to the stud-down approach of FIG. 2, is that of the stud-up approach. This approach will be described with reference to FIG. 3. In FIG. 3, elements which are the same as those in FIG. 1 have been given the same reference numerals.

To form the desired wiring structure, vias 107 and 111 are formed in an insulating layer 106 and filled, as was described for FIG. 1. A conductive material (i.e., typically metal) layer is then formed on top of the insulating layer 106 and etched to provide the wiring members 300 and 302. More particularly, the conductive layer is etched such that the wiring member 300 consists of a stud-up 306 and an interconnect 304 formed from the same conductive layer. Similarly the wiring member 302 consists of a stud-up 310 and an interconnect 308 formed from the same conductive layer.

Once the wiring members 300 and 302 have been formed, an insulating layer 312 is formed and typically planarized to be level with the top of the stud-up structures 306 and 310. Another layer of conductive material (i.e., typically metal) is then formed and processed in a similar manner to form the wiring members 314 and 316. The wiring member 314 comprises a stud-up 320 and an interconnect 318 formed of the same conductive layer. Once the wiring structures 314 and 316 have been formed, an insulating layer 324 is formed and typically planarized to be level with the top of the stud-up structure 320. One reference disclosing methods of constructing stud-up structures is the previously cited U.S. Pat. No. 4,541,893.

Like the prior art stud-down approach, the stud-up approach of FIG. 3 is advantageous over the prior art approach of FIG. 1 in that the number of processing steps and metallic interfaces in the wiring structure has been reduced.

Although the stud-down approach of FIG. 2 and stud-up approach of FIG. 3 are both advantageous in the above regards, several contact resistances remain throughout the resultant wiring structures. For example, the interfaces between the conductive materials 230 and 224, 224 and 210, 226 and 212 of FIG. 2 all contribute to an increase in contact resistance. Similarly, the interfaces between the wiring members 314 and 300, 300 and 110, 316 and 302, and 302 and 114 also increase contact resistance.

Although the stud-down and stud-up approaches of FIGS. 2 and 3 represent an improvement, these contact resistances have been found intolerable in the construction and operation of highly dense and compact integrated circuits. Thus, there exists a need for an approach which produces wiring structures having little or no internal contact resistances.

In addition to the contact resistance problem, the prior art has also been deficient in providing a versatile construction method whereby wiring structures having thick lines and thin lines can be constructed. Thick line wiring structures are important where low sheet resistance is required, and thin wiring line structures are important where low capacitance lines are needed. Consequently, a need also exists for a wiring structure approach which also has the versatility of allowing both thick and thin line wiring structures to be constructed.

SUMMARY OF THE INVENTION

The present invention provides a unique wiring structure and processing approach to satisfy the aforementioned needs.

First, since the invention facilitates the construction of a multi-level wiring structure from a single layer of conductive material, internal metallic interfaces are eliminated. The invention also provides versatility in facilitating the construction of stud-down, stud-up, and thick and thin wiring line structures from the same conductive material layer. The result is the ability to construct multi-level wiring structures which have external connection structures represented by stud-up and stud-down structures, and low resistance and low capacitance lines represented by thick and thin wiring line structures respectively. Finally, the present invention is advantageous in decreasing the number of wiring structure processing steps compared with that of the prior art.

Accordingly, the present invention relates to a metallization structure formed on an insulation layer on a processed semiconductor substrate, comprising: at least one stud-down; a plurality of interconnection lines, at least one of said plurality of interconnection lines having a first thickness and at least another one of said plurality of interconnection lines having a second thickness greater than said first thickness; and at least one stud-up, said stud-down, said plurality of interconnection lines and said stud up being formed from a single layer of metal.

Therefore, an important object of the invention is to provide a unique metallization structure having no internal metallic interfaces.

Another object of the invention is to provide a process of forming a metallization structure having no internal metallic interfaces.

Still another object of the invention is to provide a multi-level metallization structure formed of a single layer of metal.

An additional object is to provide a process of forming a multi-level metallization structure from a single layer of metal.

Another object of the invention is to provide a metallization structure having thick wiring line structures representing low resistance lines, and thin wiring line structures representing low capacitance lines.

A further object of the invention is to provide a process of forming a multi-level metallization structure having thick wiring line structures representing low resistance line and thin wiring line structures representing low capacitance lines.

Another object is to provide a process of forming a metallization structure, the process requiring fewer processing steps than that required in the prior art.

These and other objects and advantages of the invention will become more fully apparent from the follow-

BRIEF DESCRIPTION OF THE DRAWING

FIGS. 4A through 4D are simplified perspective views showing the preferred processing steps of the present invention, resulting in the construction of exemplary multi-level wiring structures.

FIG. 5 is a simplified diagram showing the exemplary wiring structures produced by the processing steps of FIGS. 4A through 4D.

DESCRIPTION OF THE PREFERRED EMBODIMENTS

Figure 1:
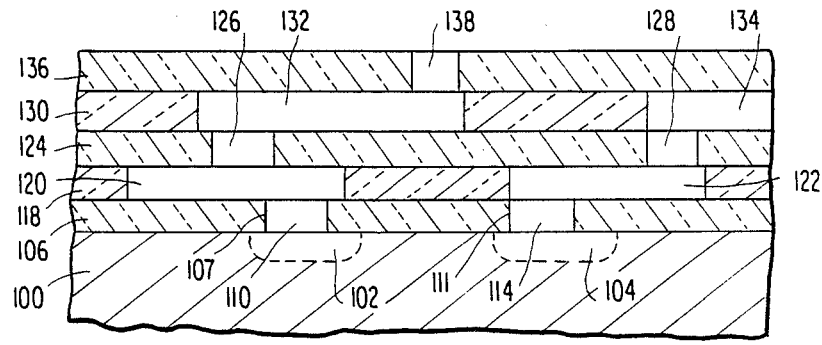
FIG. 1 is a simplified cross-sectional diagram showing a portion of a semiconductor substrate having a prior art multilayer wiring structure constructed thereon.
Figure 2:
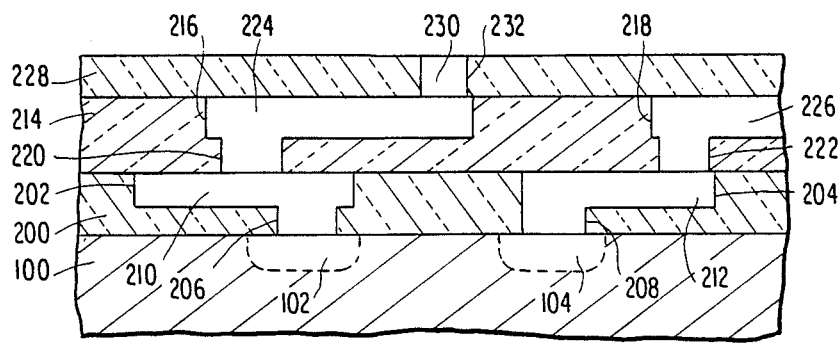
FIG. 2 is a simplified cross-sectional diagram showing a portion of a semiconductor substrate having a prior art stud-down wiring structure constructed thereon.
Figure 3:
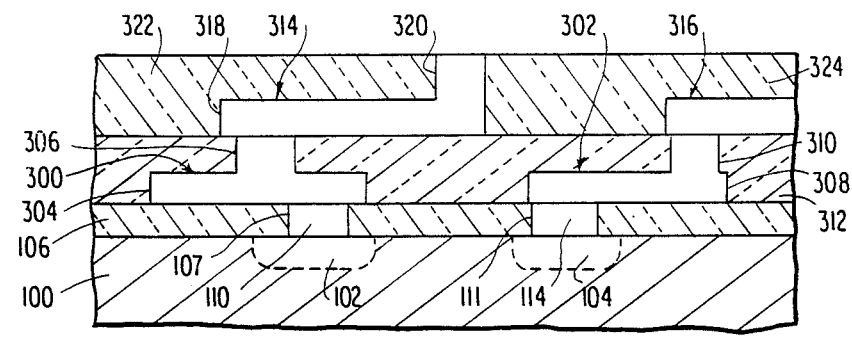
FIG. 3 is a simplified cross-sectional diagram showing a portion of a semiconductor substrate having a prior art stud-up wiring structure constructed thereon.

First, it should be understood that the height width and thickness dimensions shown in the drawing are for the sake of example and clarity only, and are not intended to designate actual or relative dimensions, i.e. some dimensions may be exaggerated to improve the clarity of the illustrations. When known, typical dimensions will be revealed through the textual description.

Figure 4A:
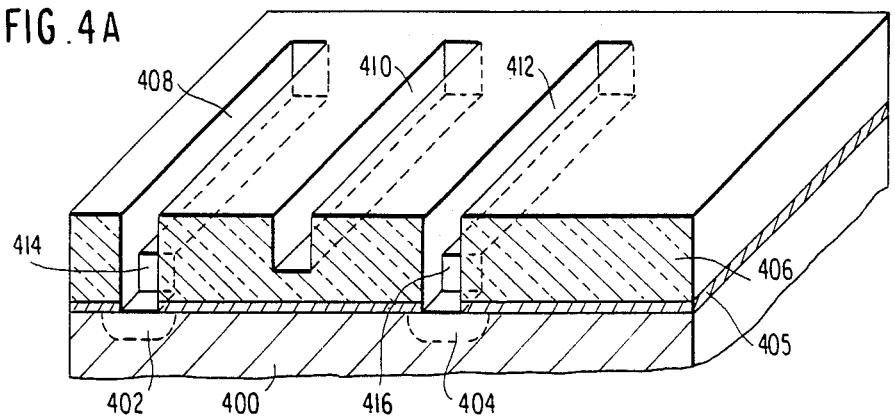

FIG. 4A shows the first processing step of the wiring structure approach of the present invention. A semiconductor substrate 400 has formed therein semiconductor circuit areas 402 and 404. A barrier layer 405 is then formed on top of the semiconductor substrate surface. The purpose of the barrier layer 405 is to prevent undesirable ions from diffusing into and contaminating, the semiconductor substrate during the high temperature processing steps to follow. In this regard any material having protective properties can be used, as long as a sufficient thickness is deposited to provide the necessary protection. In a preferred embodiment, the barrier layer 405 is composed of silicon nitride and is deposited to a thickness of several hundred angstroms.

An insulating layer 406 then is formed on top of the semiconductor substrate 400. This insulating layer 406 can be constructed of any insulating material, for example, silicon dioxide. In a preferred embodiment, this silicon dioxide layer would be slightly doped with boron or phosphorous which facilitates the use of a subsequent high temperature treatment process to improve the planarity of the insulating layer 406. By way of example, this layer would have a typical thickness of several thousand angstroms. An alternative process for improving the planarity would be a mechanical polishing process.

Once planarized, the insulating layer 406 is masked and etched to form the wiring troughs 408, 410 and 412. Any well known semiconductor etching process can be used; for example, a preferred processing embodiment uses RIE etching with a fluorinated gas. The insulating layer 406 is then again masked and etched to form the stud-down vias 414 and 416 in the wiring troughs 408 and 412, respectively. As was previously described with reference to FIG. 1, the technique of making and etching to form stud-down vias in the lower portion of a wiring through is well known in the art. As will become more apparent in the description to follow, the stud-down vias 414 and 416 serve to facilitate wiring line structure connection to the semiconductor diffusion areas 402 and 404, respectively.

Figure 4B:
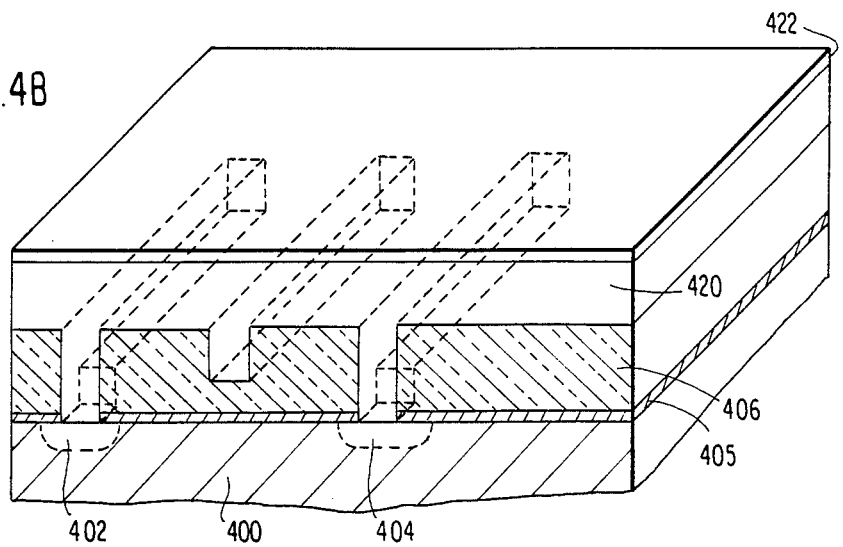

Once the wiring troughs 408, 410 and 412 and the stud-down vias 414 and 416 have been formed, a conductive material deposit is applied to the top surface of the insulating layer 406 to fill the stud-down vias 414 and 416 and the wiring troughs 408 410 and 412, and to form a layer 420 of conductive material on top of the insulating layer 406. Any conductive material can be used; however, the preferred material is a metal. Preferred metals include Tungsten, Tungsten alloys and tungsten. To deposit the conductive material layer, any of the well known deposition processes can be used, for example, chemical-vapor-deposition (CVD), evaporation and sputtering. Chemical-vapor-deposition of aluminum is preferred, as this combination produces the best results in filling the wiring troughs and stud-down vias. Also, the conductive material should be deposited in a conformal manner such that planarity of the layer 420 is maintained. The result is shown in FIG. 4B.

As to the thickness of the conductive material layer 420, it will become apparent from the following description that the layer should be of sufficient thickness to facilitate the construction of the desired wiring line structures. This thickness is dependent on a number of factors, for example, the number of wiring levels needed, the resistivity of the conductive material used, the resistive and capacitive constraints on the wiring line structures, and packaging constraints. Experimentation can be used to determine the exact thickness required. In one example, the conductive material layer is deposited to a thickness of 15000 angstroms.

The material filling the stud-down vias 414 and 416 and the wiring troughs 408, 410 and 412, and the conductive material layer 420 are formed from a single homogeneous body of conductive material, since they are formed during a single deposition of conductive material. Thus, the conductive material layer 420 represents a layer having no internal metallic interfaces.

Figure 4C:
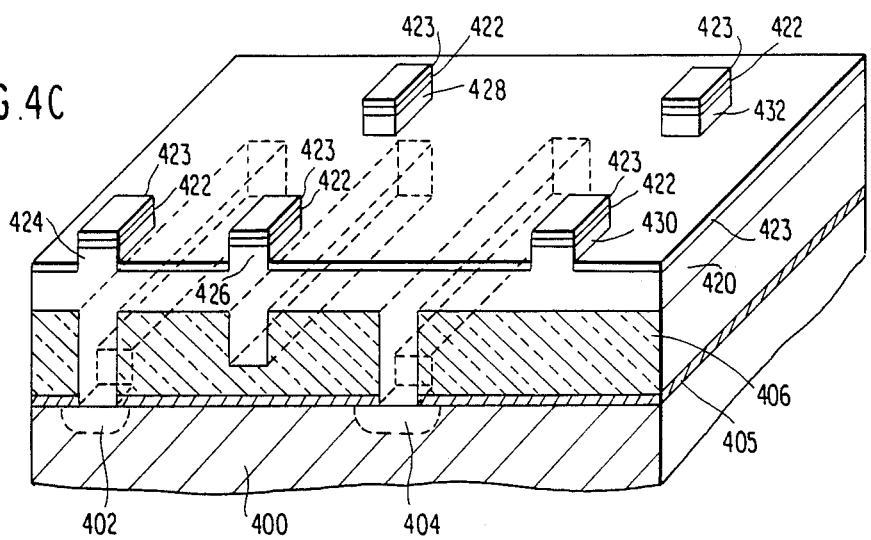

Once sufficient depositing has been made to achieve a conductive material layer of a desired thickness, a mask material 422 is applied to the top surface of the conductive material layer 420. A first resist mask and exposure (not shown) are then applied to cause the mask material 422 to remain in areas where stud-up structures are to be formed on the desired wiring structure. The conductive material layer 420 is then etched to provide the stud-up structures 424, 426, 428, 430 and 432 as shown in FIG. 4C. In this and subsequent etching of the conductive material layer 420, any of the well known semiconductor etching processes can again be used. In a preferred embodiment, reactive-ion-etching would be used. Note that the conductive material layer 420 has been etched only a portion of the way through its thickness.

Once the stud-up structures 424, 426, 428, 430 and 432 have been defined by the etching process, a second mask layer 423 is formed and masked to define desired wiring line structures. Note that in this step, the previous mask material 422 which was used to provide the resist portions for the stud-up structures may be removed or, alternatively, the second mask material 423 may be formed over the first mask material 422. As a further etching process is to be applied to form the desired wiring line structures, the first mask material 422 is maintained in a preferred embodiment to avoid alignment problems in having to reform mask material on top of the desired stud-up structures. Thus, the second mask material 423 is shown formed over the remaining portions of the first mask material 422 FIG. 4C.

Once the second mask material 423 has been masked to define the desired wiring line structures, the remaining thickness of the conductive material layer 420 is subjected to a second etching process. Etching is stopped at the top level of the insulating layer 406 such that conductive material lying within the stud-down vias and the wiring troughs is allowed to remain.

Note that in the resultant structure of FIG. 4D there is shown only the first mask material 422 remaining on top of the desired stud-up structures. Although the second mask material 423 had also been formed over these portions, these portions were left unmasked and were subsequently removed by the second etching process. In contrast, portions of the second mask material 423 are shown remaining at areas where wiring line structures were desired.

Once etching has been conducted to the top of the insulating layer 406, the remaining portions of the first mask material 422 and second mask material 423 can be removed or left in place. In a preferred embodiment, mask material portions on top of desired stud-up structures are removed to facilitate clean electrical contact.

After the processing steps described above, additional insulating material can be deposited on top of the insulating layer 406 and planarized to be level with the top of the desired stud-up structures. This serves to provide additional stability and integrity to the resultant wiring structure, as well as insulating protection to the encased wiring line structures. In a preferred embodiment, this additional insulating material is silicon dioxide.

The wiring structures produced by the preferred processing steps of FIGS. 4A through 4D were chosen as examples to illustrate desirable features of the present invention, as well as the versatility of the present invention. Formation of the additional insulating layer described above has not been shown. Instead, the exemplary wiring structures resulting from the processing steps of FIGS. 4A through 4D are shown in FIG. 5 as having been removed from the insulating layer 406.

Turning now to a detailed description, there are shown four exemplary wiring structures 450, 452, 454 and 456 as having been formed. In a first exemplary structure, the wiring structure 450 in FIG. 4D and FIG. 5 has a stud-up structure or upper extending portion 424, a stud-down structure or lower extending portion 464, and a thick wiring line structure or portion 442. In addition, the wiring structure 450 has a thin lateral wiring line structure or lateral extending portion 460. Note that the entire structure of the wiring structure 450, including the stud-up structure 424, the stud-down structure 464, the thick wiring line structure 442 and the lateral wiring line structure 460, has been formed from the same layer of conductive material. Thus, the wiring structure 450 is a homogeneous conductive material structure, which in a preferred embodiment, is formed of a metal. Thus, there is provided an electrical conduction path, from the stud-down structure 464 to the stud-up structure 424, which has no internal metallic interfaces and therefore, internal contact resistance.

The stud-down structure 464 is produced by conductive material which filled the stud-down via 414 described with reference to FIG. 4A. Similarly, the lower portion of the thick wiring line structure 442 is produced by conductive material which filled the wiring trough 408 described with reference to FIG. 4A. The upper portion of the thick wiring line structure 442 and also the thin lateral wiring line structure 460 are formed by the masking and etching of the conductive material layer 420 in accordance with the second mask material 423, as was described with reference to FIG. 4D. Finally, the stud-up structure 424 is formed by the masking and etching of the conductive material layer 420 in accordance with the first mask material 422, as was described with reference to FIG. 4C.

The thick wiring line structure 442 is thick in the sense that its thickness includes a substantial portion of the thickness between the stud-up and stud down structures. In contrast, as will be described below, the remaining wiring line structures in the example include a much smaller portion of this thickness (e.g. one-half the thickness). As the thick wiring line structure 442 has a greater cross-sectional area along its length in comparison to the remaining lines, the thick wiring line structure 442 represents a line of lower resistance. Thus, in addition to providing a method of forming thick low resistance lines, the present invention also provides a mechanism whereby the resistance value of these thick lines can be controlled without increasing wiring pitch.

In this regard, note that the thick wiring line structure 442 is indicated in FIGS. 4D and 5 as having a thickness "a", which represents the depth of the wiring trough 408 plus a thickness portion of the conductive material layer 420. As the thickness of this thick wiring line structure 442 can easily be controlled, either by controlling the depth of the wiring trough 408 or by controlling the thickness of the conductive material layer 420 used above the wiring trough 408, the resistance of the line 442 can also be controlled.

Let us now turn to a more detailed description of the second exemplary structure. The wiring structure 452 is shown having been formed with both stud-up structures 426 and 428 and also a thin wiring line structure 462. In particular, the stud-up structures 426 and 428 were formed by the etching of the conductive material layer 420 in accordance with the first mask material 422 was described with reference to FIGS. 4B and 4C. The thin wiring line structure 462 is formed by conductive material which filled the wiring trough 410 as was described with reference to FIG. 4A. The second wiring structure 452 also represents a homogeneous conductive material body formed from a single layer which, in a preferred embodiment, is a metal.

The thin wiring line structure 462 is thin in the sense that its thickness includes only a smaller portion of the thickness lying between the stud-down and stud-up structures (e.g., typically one-half the thickness). Note that the wiring line structure 462 is indicated in FIG. 4D as having a thickness "b" which exactly corresponds to the depth of the wiring trough 410 as was described with reference to FIG. 4A.

The wiring structure features of the second wiring structure 452 are advantageous in several respects. First, note that the wiring structure 452 is an underpass wiring structure having no internal metallic interfaces allowing the connection of two stud-up structures 426 and 428. The thin wiring line structure 462 which serves to connect the stud-up structures 426 and 428, is insulated from the semiconductor substrate 400 by the portion of the insulating layer 406 lying below the wiring line structure 462. The wiring line structure 462 would be further insulated from above if additional insulating material were formed above the top of the insulating layer 406, as was previously mentioned.

Another advantage of the second wiring structure 452 concerns capacitive effects. Often in semiconductor devices, there can be a substantial capacitive effect between adjacent wiring line structures. An important feature of the wiring structure 452 is that the thin wiring line structure 462 is a line which serves to reduce this capacitive effect. If the wiring line structure 462 had been constructed as a thick wiring line structure, there would be a substantial capacitive effect between the wiring structures 450 and 452, because the wiring line structures 442 and 462 would act as the parallel plates of a capacitor. As the "parallel plate" area is substantially decreased through the use of the thin wiring line structure, the capacitive effect is also decreased.

Although the thin wiring line structure is a low capacitance line, the smaller cross-sectional area along its length, in comparison to the thick wiring line structure, means that this is a line of greater resistance. Thus, the present invention provides the versatility of constructing a thin low capacitance wiring line structure, with the trade off of increased line resistance.

Let us now turn to a detailed description of the third exemplary structure. The wiring structure 454 is similarly of a thin, low capacitance nature. More particularly, the wiring structure 454 is constructed of a thin wiring line structure 466 and a stud-down structure 468. The stud-down structure 468 is formed from conductive material which filled the stud-down via 416 described with reference to FIG. 4A and 4B. The thin wiring line structure 466 is formed from conductive material which filled the wiring trough 412, as was described with reference to FIGS. 4A and 4B. Although the third wiring structure 454 is a thin low capacitance structure similar to that of the second wiring structure 452, note that the third wiring structure 454 provides an underlying circuit interconnection to a semiconductor diffusion area 404. This is in contrast to the underlying circuit interconnection between two stud-up structures as was the case of the second wiring structure 452.

In addition to a capacitive effect between adjacent wiring line structures, a capacitive effect may also occur between a wiring line structure and the semiconductor substrate body 400. As an example, the thin wiring line structures 462 and 466 could act as first parallel capacitor plates separated from the second semiconductor substrate plate 400 by a distance "d". This distance "d", indicated in FIGS. 4D and 5, corresponds to the portion of the insulating layer 406 underlying and insulating the thin wiring line structures 462 and 466 from the semiconductor substrate 400. One method of reducing the capacitive effect between the thin wiring lines and the semiconductor substrate 400 is to increase the separation distance d. This increased separation from the semiconductor substrate 400 is achieved by the fourth wiring structure 456.

To illustrate this increased separation distance, a dashed line 470 has been added in FIG. 5 to represent the top of the insulating layer 406 and a dashed line 472 has been added to represent the top of the semiconductor substrate body 400.

In the second and third wiring structures 452 and 454, respectively, the thin wiring line structures 462 and 466 are formed from conductive material which filled the wiring troughs 410 and 412, respectively. In contrast, the thin wiring line structure 446 of the fourth wiring structure 456 is formed from a portion of the conductive material layer 420 lying above the top surface of the insulating layer 470.

In the example illustrated, the fourth wiring structure 456 represents a wiring structure which further reduces capacitive effects in several respects. First, capacitive effects between adjacent thin wiring line structures 466 and 446 are further reduced because the lines are offset relative to each other, as opposed to the lines 462 and 466 which are in the same plane. Next, note that since the thin wiring line structure 446 is formed from conductive material lying on top of the insulating layer 406 rather than from conductive material filling a wiring trough, the separation distance "e" from the semiconductor substrate 400 has been increased over the previous separation distance d. This increased separation from the semiconductor substrate 400 results in a decreased capacitive effect between the thin wiring line structure 446 and the semiconductor substrate 400.

In the preferred embodiment described above, there has been disclosed a unique processing approach which facilitates the construction of multi-level wiring structures formed from a homogeneous body of conductive material. More particularly, the construction approach of the present invention achieves the construction of multi-level wiring structures having no internal metallic interfaces and therefore, internal contact resistance. In addition to the above advantage, the approach of the present invention also provides the versatility of constructing stud-up, stud-down, and thick and thin wiring line structures. The thick wiring line structures are low resistance lines, and the thin wiring line structures are low capacitance lines. Finally, the separation distance of thin low capacitance lines from the semiconductor substrate can be controlled further to reduce capacitive effects between the thin wiring line structures and the semiconductor substrate.

The wiring structure and method of the present invention, and many of their attendant advantages, will be understood from the foregoing description. It will be apparent that various obvious changes can be made in the steps, form, construction and arrangement of the parts of the invention, without departing from the spirit and scope of the invention, the form thereof described above being merely a preferred or exemplary embodiment of the invention which is defined in the following claims.

What is claimed is:

1. A process for forming a multi-level metallization structure on a processed semiconductor substrate, comprising the steps of:

forming a planar insulating layer on said processed semiconductor substrate;

masking and etching said planar insulating layer to form a plurality of wiring troughs in an upper portion of said insulating layer and at least one stud-down via in a lower portion of said insulating layer;

depositing a layer of metal to fill both of said at least one stud-down via and said plurality of wiring troughs, and to form a coating of a thickness X on top of said planar insulating layer;

masking and etching said layer of metal to define at least one stud-up as well as a plurality of interconnection lines, at least one of said plurality of interconnection lines being defined by said layer of metal within one of said plurality of wiring troughs and by a portion of said layer of metal said portion being of a thickness less than X and at least another one of said plurality of interconnecting lines being defined solely by said layer of metal within one of said plurality of wiring troughs;

so that said stud-down, said plurality of interconnection lines, and said stud-up are all formed from a single layer of metal.

2. A process for forming a multi-level wiring structure on a processed semiconductor substrate, comprising:

forming an insulating layer on said processed semiconductor substrate;

masking and etching said insulating layer to define a plurality of wiring troughs;

further masking and etching said insulating layer to define at least one stud-down via in a lower portion of at least one of said wiring troughs;

depositing a layer of conductive material to fill each said stud-down via and said plurality of wiring troughs, and to form a layer of conductive material of a predetermined thickness on top of said insulating layer;

masking and etching said conductive layer to form at least one stud-up structure; and further masking and etching said conductive layer to form a plurality of thick and thin interconnection lines, said thick interconnection lines being defined by the conductive material within a wiring trough and some of the conductive material above the trough, said thin interconnection lines being defined by either the conductive material solely within a wiring trough or a thickness of said conductive material not lying above a wiring trough;

so that said stud-down, said stud-up, said thick interconnection lines and said thin interconnection lines are formed from the same deposit of conductive material.

3. A method of forming a low resistance multi-level wiring structure which comprises:

a stud-up structure;

a stud-down structure; and a thick wiring line structure having an upper wiring line portion and a lower wiring line portion;

said multi-level wiring structure being formed on a processed semiconductor substrate, wherein said method comprises the following steps:

forming an insulating layer on said processed semiconductor substrate;

masking and etching said insulating layer to define a wiring trough which is to be filled with conductive material to form said lower wiring line portion;

masking and etching said insulating layer to define a stud-down via;

depositing a layer of conductive material to fill said wiring trough and said stud-down via, and to form a layer of conductive material of a predetermined thickness on top of said insulating layer;

masking and etching said conductive material to form at least one stud-up structure; and masking and etching said conductive layer to define said upper wiring line portion;

wherein said multi-level wiring structure is formed from the same deposit of conductive material.

4. A method of forming a low capacitance multi-level wiring structure which comprises:

a stud-up structure;

a stud-down structure; and a thin wiring line structure having a lower wiring line portion;

said multi-level wiring structure being formed on a processed semiconductor substrate, wherein said method comprises the following steps:

forming an insulating layer on said processed semiconductor substrate;

masking and etching said insulating layer to define a wiring trough which is to be filled with conductive material to form said lower wiring line portion;

masking and etching said insulating layer to define a stud-down via;

depositing a layer of conductive material to fill said wiring trough and said stud-down via and to form a layer of conductive material of a predetermined thickness on top of said insulating layer;

masking and etching said conductive material to form at least one stud-up structure;

wherein said multi-level wiring structure is formed from the same deposit of conductive material.

* * * * *